US012813251B2

(12) United States Patent
Lin

(10) Patent No.: US 12,813,251 B2
(45) Date of Patent: Nov. 24, 2026

(54) INTERCONNECT STRUCTURE AND METHODS OF FORMING THE SAME

(71) Applicant: TAIWAN SEMICONDUCTOR MANUFACTURING COMPANY, LTD., Hsinchu (TW)

(72) Inventor: Ming-Hsien Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1197 days.

(21) Appl. No.: 17/691,583

(22) Filed: Mar. 10, 2022

(65) Prior Publication Data

US 2022/0406718 A1 Dec. 22, 2022

Related U.S. Application Data

(60) Provisional application No. 63/211,743, filed on Jun. 17, 2021.

(51) Int. Cl.
*H10W 20/41* (2026.01)
*H10W 20/00* (2026.01)
*H10W 20/42* (2026.01)

(52) U.S. Cl.
CPC ....... *H10W 20/427* (2026.01); *H10W 20/056* (2026.01); *H10W 20/081* (2026.01); *H10W 20/42* (2026.01)

(58) Field of Classification Search
CPC ........... H01L 23/5286; H01L 21/76802; H01L 21/76877; H01L 23/5226; H01L 21/76843; H01L 23/522; H01L 23/5283
USPC ........................................................ 257/773
See application file for complete search history.

(56) References Cited

U.S. PATENT DOCUMENTS 6,468,894 B1 * 10/2002 Yang ................. H01L 21/76819 438/678
2004/0125572 A1 * 7/2004 Lee ....................... H01L 23/367 257/E23.102
2010/0001412 A1 * 1/2010 Chang .................. H01L 23/522 257/E23.141
2012/0181694 A1 * 7/2012 Usami ............... H01L 23/53295 438/618
2016/0336183 A1 * 11/2016 Yuan .................. H10D 30/6219
(Continued)

OTHER PUBLICATIONS

Chun-Jen Weng, "Process integrated of high aspect ratio copper dual damascene process," 2009 IEEE International Conference of Electron Devices and Solid-State Circuits (EDSSC), Xi'an, China, 2009, pp. 12-15, doi: 10.1109/EDSSC.2009.5394250. (Year: 2009).*

*Primary Examiner* — Jacob Y Choi
*Assistant Examiner* — Neil R Prasad
(74) *Attorney, Agent, or Firm* — NZ Carr Law Office

(57) ABSTRACT

An interconnect structure and methods of forming such, are described. The interconnect structure includes a first dielectric layer, first and second conductive lines disposed in the first dielectric layer, a second dielectric layer disposed over the first dielectric layer, a power rail disposed in the second dielectric layer, first conductive via disposed between the power rail and the first conductive line, second conductive via disposed between the power rail and the second conductive line, and one or more dummy vias disposed between the power rail and the first dielectric layer. The power rail and the one or more dummy vias are monolithic.

20 Claims, 15 Drawing Sheets

(56) References Cited

U.S. PATENT DOCUMENTS

2018/0350791 A1* 12/2018 Do ........................ H01L 23/485
2021/0265264 A1* 8/2021 Chou .................. H01L 23/5226

* cited by examiner

INTERCONNECT STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, as the aspect ratio of conductive features in the dielectric material in the back-end-of-line (BEOL) interconnect structure gets higher, electrical resistivity increases. Metal resistivity is a dominant factor on system-level performance, and more issues could emerge in more BEOL sensitive products like larger chips. Furthermore, electromigration lifetime of the metal lines also decreases due to technology scaling. Therefore, improved interconnect structures are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
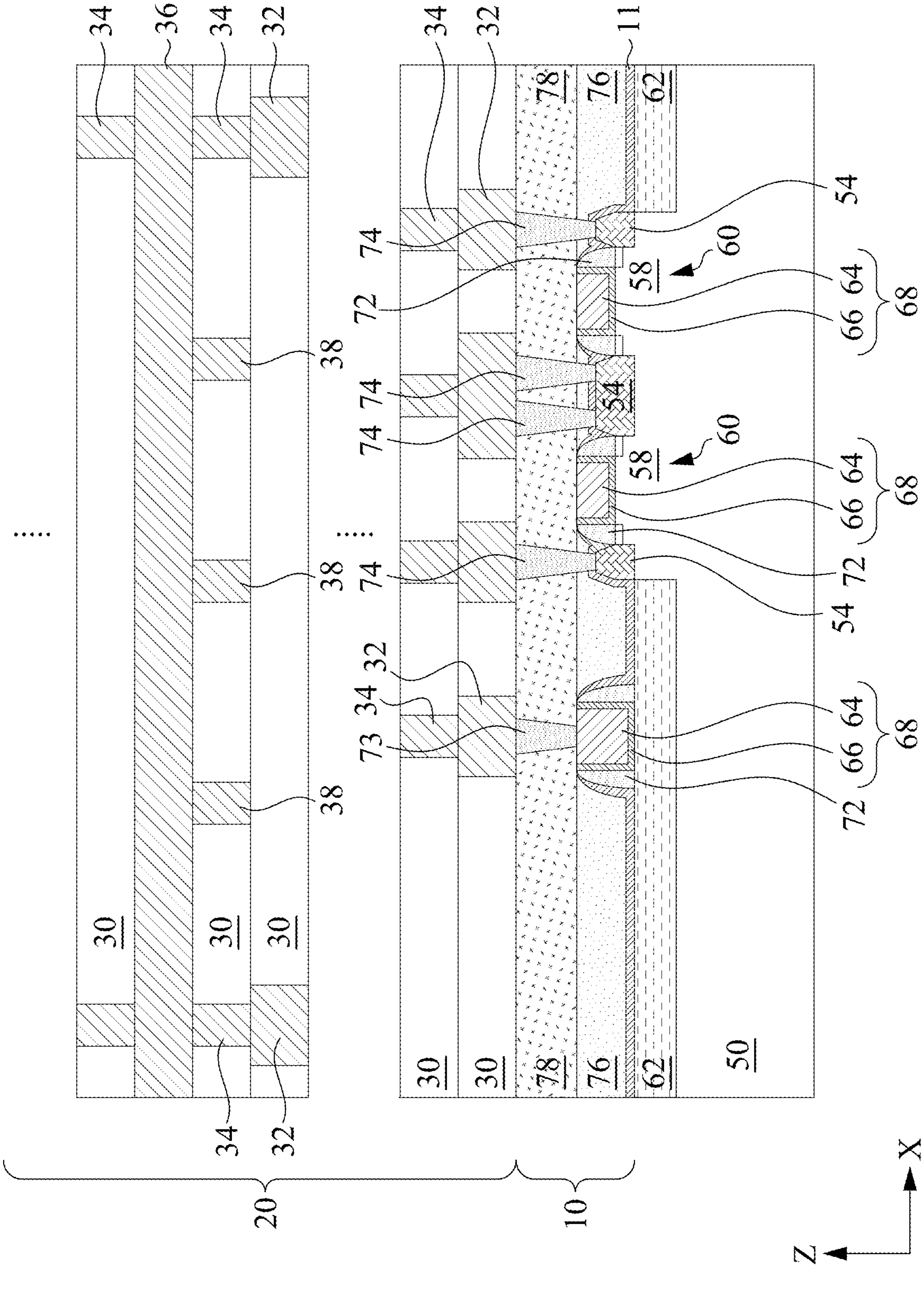
FIG. 1A is a cross-sectional side view of a semiconductor device structure and an interconnect structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure describes embodiments of a multilevel interconnect structure including power rails, conductive lines, contacts, and vias used to interconnect electronic devices and distribute electrical power and signals in an integrated circuit, as specified by a circuit design. FIG. 1A is a cross-sectional side view of an interconnect structure 20 disposed over a semiconductor substrate 50 on which electronic devices, such as fin field-effect transistors (FinFETs) 60, may be formed. Conductive elements, referred to as contacts 74, are shown making electrical connections to the source/drain regions (or source/drains) 54. A contact 73 is shown making electrical connection to a gate electrode (or gate) 64. The gate 64 shown at the left side of FIG. 1A may be connected to an electronic device (e.g., a FinFET, a MOS capacitor, a metal-insulator-metal (MIM) capacitor, or a resistor, or the like) not visible in the cross-sectional view of FIG. 1A. The contacts 73 and 74 may extend vertically through one or more dielectric layers (e.g., a first interlayer dielectric (ILD1) 76 and a second interlayer dielectric (ILD2) 78, collectively referred to as ILD 10. The ILD 10 includes a dielectric material, such as silicon oxide, phosphosilicate glass (PSG), borosilicate glass (BSG), boron-doped phosphosilicate glass (BPSG), undoped silicate glass (USG), or the like. The dielectric materials used to form the ILD 10 may be deposited using any suitable method, such as CVD, PECVD, FCVD, spin-on, and/or the like, or a combination thereof. The contacts 73 and 74 connect electronic devices formed on the substrate 50 to some of the conductive elements in the interconnect structure 20. The contacts 73 and 74 are electrically conductive and include a material having one or more of Ru, Mo, Co, Ni. W, Ti, Ta, Cu, Al, TiN or TaN. The contacts 73 and 74 may be formed by any suitable method, such as electro-chemical plating (ECP), or PVD.

As shown in FIG. 1A, the interconnect structure 20 includes a plurality of dielectric layers 30. The dielectric layers 30 may be referred to as the intermetal dielectrics. Each dielectric layer 30 includes a low-k dielectric material having a low dielectric constant (k) relative to that of stoichiometric amorphous $SiO_2$, which has a k value of 3.9. In some embodiments, the dielectric layers 30 include the same material as the ILD 10. A plurality of conductive lines 32 and a plurality of conductive vias 34 are disposed in the dielectric layers 30, as shown in FIG. 1A. The plurality of conductive lines 32 and vias 34 are arranged in the interconnect structure 20 to provide electrical routing from and to the devices, such as FinFETs 60, disposed on the semiconductor substrate 50. The conductive lines 32 and vias 34 are made from one or more electrically conductive materials, such as metal, metal alloy, metal nitride, or silicide. For example, the conductive lines 32 and vias 34 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof. In some embodiments, barrier layers (not shown) may be disposed between each conductive line 32 and via 34 and the dielectric layer 30 to prevent metal diffusion into the dielectric layer 30. In some embodiments, etch stop layers may be formed between adjacent dielectric layers 30.

The interconnect structure 20 further includes one or more power rails 36 electrically connected to the conductive vias 34. The power rails 36 are used to distribute electrical power to the devices, such as the FinFETs 60, disposed on the semiconductor substrate 50 via the conductive lines 32 and vias 34. The power rails 36 are disposed in one or more dielectric layers 30. The power rails 36 may include the same material as the conductive lines 32 and vias 34. In some embodiments, barrier layers (not shown) may be disposed between each power rail 36 and the dielectric layer 30 to prevent metal diffusion into the dielectric layer 30. One or more dummy vias 38 are connected to each power rail 36 to reduce electrical resistance and Joule-heating effect on the power rail 36. The electromigration lifetime of the power rail 36 is also increased by having the dummy vias 38. The power rails 36 may be disposed in the dielectric layer 30 that is located near the top of the interconnect structure 20. In some embodiments, there are at least 5 dielectric layers 30 disposed between the dielectric layer 30 in which the power rails 36 are disposed therein and the devices, such as the FinFETs 60. The power rails 36 are located relatively higher in the interconnect structure 20 so that the dummy vias 38 and dummy lines 318 (FIG. 3B) are not in contact with any conductive lines 32 or vias 34. In some embodiments, the dummy vias 38 has a substantially rectangular cross-section. The shape of the dummy via 38 is not limited to substantially rectangular. FIGS. 7A-7E illustrate cross-sectional views of the dummy via 38 according to various embodiments. As shown in FIGS. 7A-7E, the cross-section shape of the dummy via 38 may be any suitable shape. The power rails 36 and the dummy vias 38 are described in detail below.

The semiconductor substrate 50 shown in FIG. 1A may include a bulk semiconductor substrate or a silicon-on-insulator (SOI) substrate. An SOI substrate includes an insulator layer (not shown) below a thin semiconductor layer (not shown) which is the active layer of the SOI substrate. The semiconductor of the active layer and the bulk semiconductor generally include crystalline silicon, but may include one or more other semiconductor materials such as, germanium, silicon-germanium alloys, compound semiconductors (e.g., GaAs, AlAs, InAs, GaN, AN, and the like) or their alloys, oxide semiconductors (e.g., ZnO, $SnO_2$, $TiO_2$, $Ga_2O_3$, and the like), or combinations thereof. The semiconductor materials may be doped or undoped. Other substrates that may be used include multi-layered substrates, gradient substrates, or hybrid orientation substrates.

Figure 1B:
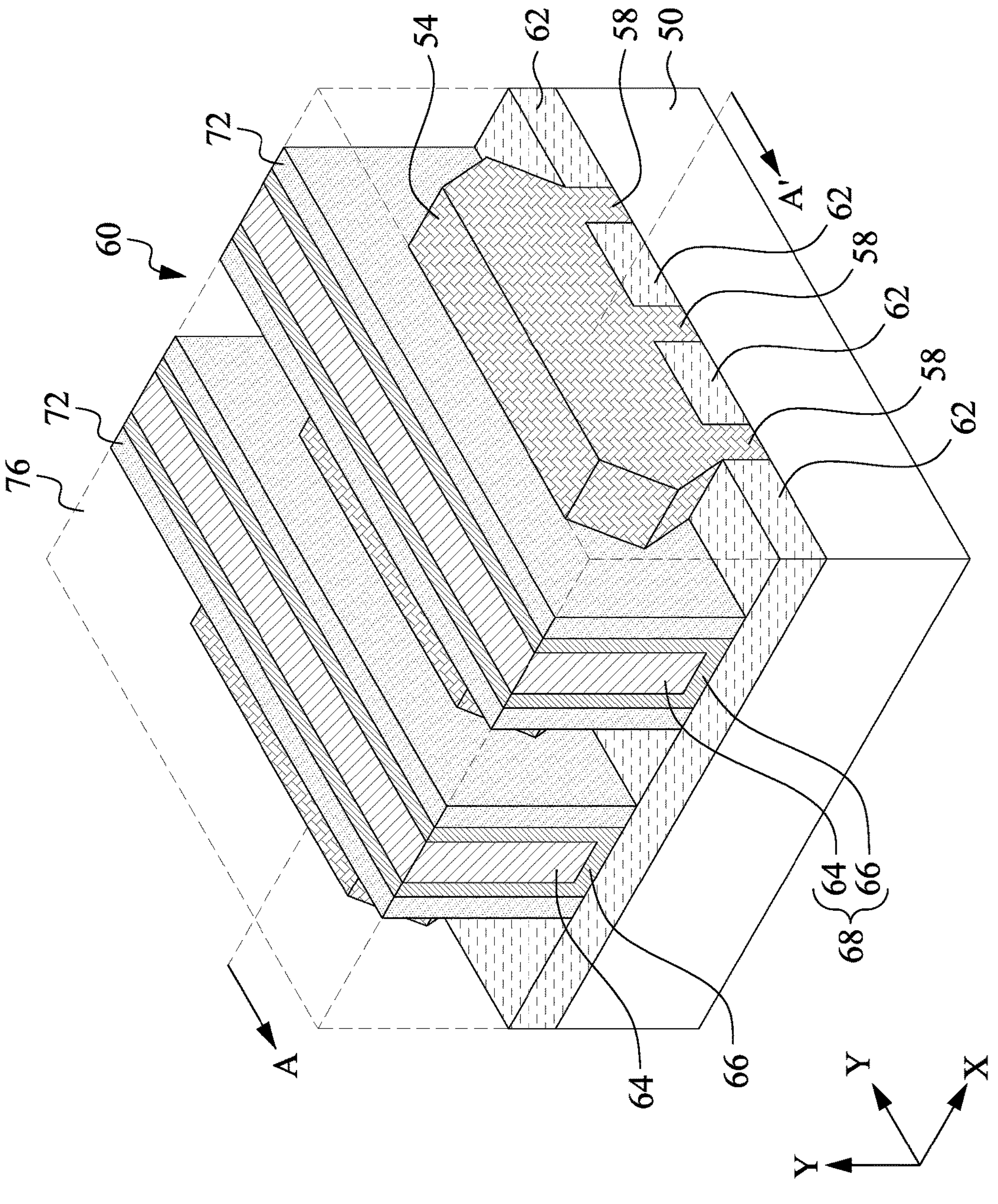
FIG. 1B is a perspective view of an example of a FinFET, in accordance with some embodiments.

The FinFET 60 illustrated in FIG. 1A is a three-dimensional metal-oxide-semiconductor FET (MOSFET) structure formed in fin-like strips of semiconductor protrusions referred to as fins 58. FIG. 1B is a perspective view of an example of a FinFET 60, in accordance with some embodiments. The FinFET 60 includes one or more gate structures 68, each gate structure 68 including a gate dielectric layer 66 and the gate 64, disposed over the sidewalls and top surfaces of three fins 58. The gate structures 68 also extend over the shallow trench isolation (STI) regions 62. The STI regions 62 are disposed over the semiconductor substrate 50 and between adjacent fins 58. Spacers 72 are disposed along opposing sidewalls of the gate structures 68. The source/drain regions 54 illustrated in FIG. 1B are semiconductor regions formed using selective epitaxial growth over the fins 58. The source/drain regions 54 are spaced from the gate structures 68 by the spacers 72. In the example illustrated in FIG. 1B, the epitaxial growth over adjacent fins 58 have merged. The fin 58 may be formed by patterning the substrate using photolithography and etching techniques. FIG. 1A illustrates a single fin 58, although the semiconductor substrate 50 may include any number of fins 58.

The STI regions 62 may be formed by depositing one or more dielectric materials (e.g., silicon oxide) to completely fill the trenches around the fins 58 and then recessing the dielectric materials. The dielectric materials of the STI regions 62 may be deposited using a high-density plasma enhanced chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed.

In some embodiments, the gate structure 68 of the FinFET device 60 illustrated in FIGS. 1A and 1B is a high-k, metal gate (HKMG) gate structure that may be formed using a replacement gate process flow. In a replacement gate process flow, the HKMG gate structure 68 replaces a sacrificial dummy gate structure (not shown). The gate structures 68 includes the gate dielectric layer 66 and the gate 64. The gate dielectric layer 66 includes one or more dielectric materials, including a high-k dielectric, in accordance with some embodiments. Examples of a high-k dielectric include an oxide or a silicate of Hf, Al, Zr, La, Mg, Ba, Ti, Pb, and combinations thereof. The gate dielectric layer 66 may be formed using any suitable deposition technique such as, CVD, remote plasma CVD (RPCVD), molecular beam deposition (MBD), atomic layer deposition (ALD), or the like.

In some embodiments, the gate 64 may be a multilayered metal gate stack including a barrier layer, a work function layer, and a gate-fill layer formed successively on top of the gate dielectric layer 66. Examples of a barrier layer include TiN, TaN, Ti, Ta, or the like, or a multilayered combination thereof. Examples of a work function layer include TiN, TaN, Ru, Mo, Al, for a pMOS transistor, and Ti, Ag, TaAl, TaAlC, TiAlN, TaC, TaCN, TaSiN, Mn, Zr, for an nMOS transistor. The gate-fill layer may include metals, such as Cu, Al, W, Co, Ru, or the like, or combinations thereof, or multi-layers thereof. The gate 64 may be formed using CVD, RPCVD, PECVD, PVD, ALD, PEALD, electroplating (ECP), electroless plating, or the like.

The example HKMG gate structures 68 (seen on the top of fin 58) extends along sidewalls of and over the portion of fin 58 protruding above the STI 62, as illustrated in the perspective view shown in FIG. 1B. The example HKMG gate structure 68 on the left side in FIG. 1A extends over the STI region 62, and the gate 64 may be connected to an electronic device (e.g., a FinFET, a MOS capacitor, a metal-insulator-metal (MIM) capacitor, or a resistor, or the like) not visible in the cross-sectional view of FIG. 1A.

In some embodiments, the source/drain regions 54 may include heavily-doped regions and relatively lightly-doped drain extensions, or LDD regions. The LDD regions may be formed, for example, by implanting dopants (e.g., As, P, B, In, or the like) using an ion implantation process. The source/drain regions 54 may include an epitaxially grown region. For example, after forming the LDD regions, the spacers 72 may be formed and, subsequently, the heavily-doped source/drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin 58 to form a raised source-drain structure, as illustrated in FIG. 1A. The crystalline semiconductor material may be elemental (e.g., Si, or Ge, or the like), or an alloy. The SEG process may use any suitable epitaxial growth method (e.g., vapor/solid/liquid phase epitaxy (VPE, SPE, LPE), or metal-organic CVD (MOCVD), or molecular beam epitaxy (MBE), or the like.

As illustrated in FIG. 1A, electrical connections to the source/drain regions 54 of the FinFETs 60 may be made by the contacts 74 extending through the dielectric layers of ILD 10 and contact etch stop layer (CESL) 11 over the fins 58. A contact 73 extending through ILD2 78 (shown on the left side in FIG. 1A) illustrates electrical connections made to the gates 64 formed over STI regions 62.

In some embodiments, a conformally deposited conductive liner (not shown) may be disposed between the contacts 73, 74 and the ILD2 78. The liner includes metals used to help enhance adhesion and is a barrier to prevent the diffusion of the material of contacts 73, 74 into the surrounding dielectric materials. In some embodiments, the liner may include one or more metal layers. In some embodiments, the liner includes TiN, TaN, Ta, or other suitable metals, or their alloys. The interconnect structure 20 is disposed on the ILD2 78, and the conductive lines 32 and vias 34 are electrically connecting the devices, such as the FinFETs 60, to the power rails 36.

Figure 2A:
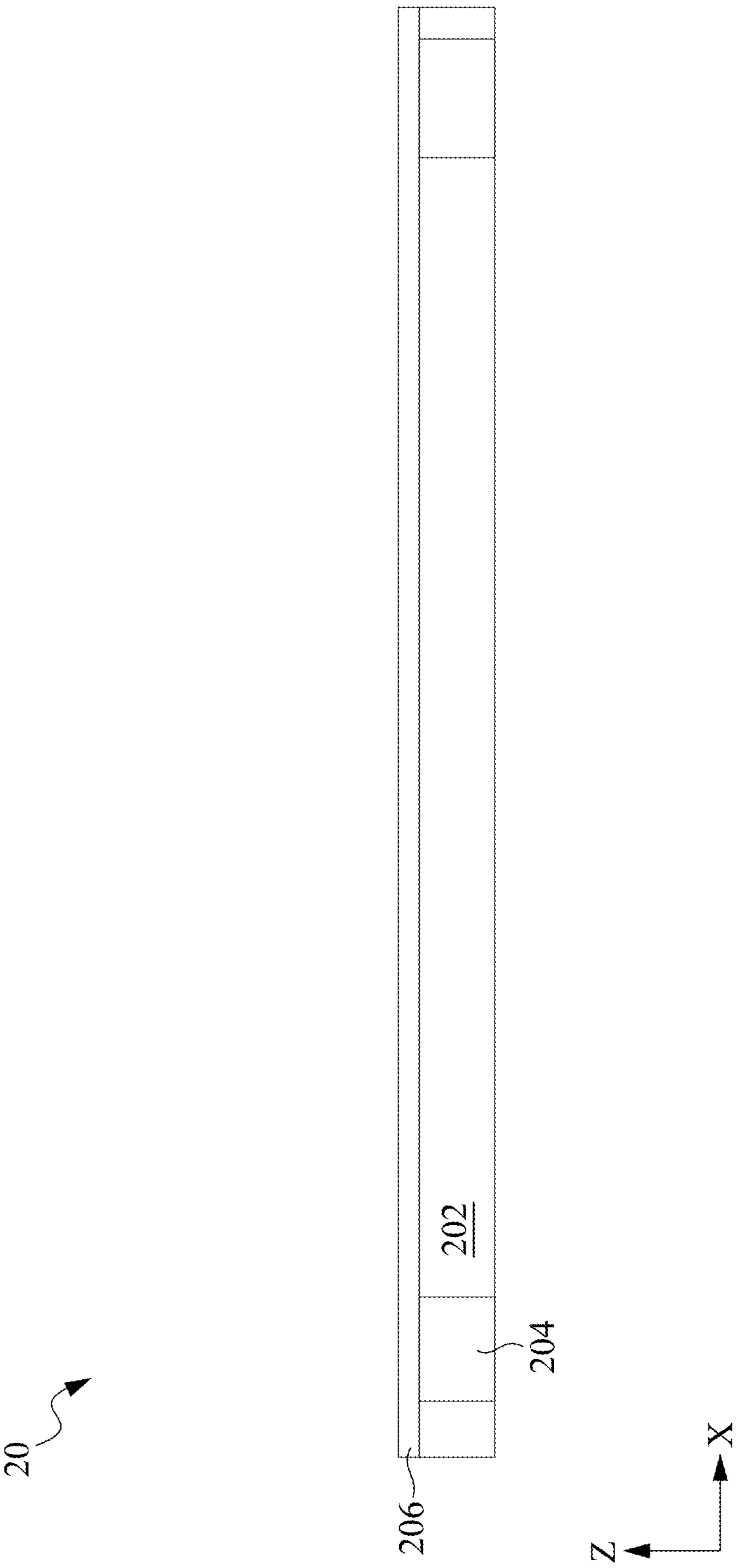
FIGS. 2A-2C are cross-sectional side views of various stages of manufacturing an interconnect structure, in accordance with some embodiments.
Figure 2B:
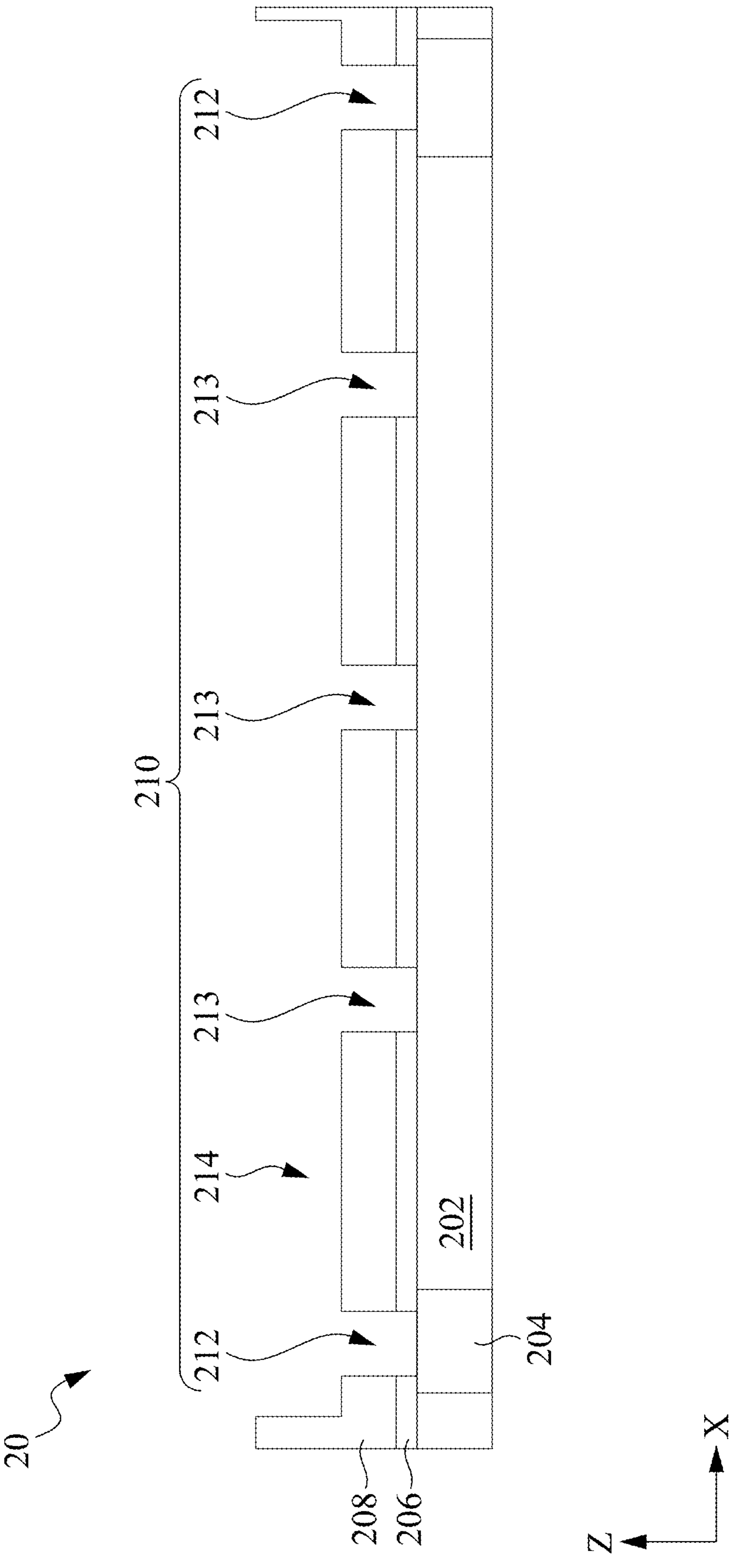
Figure 2C:
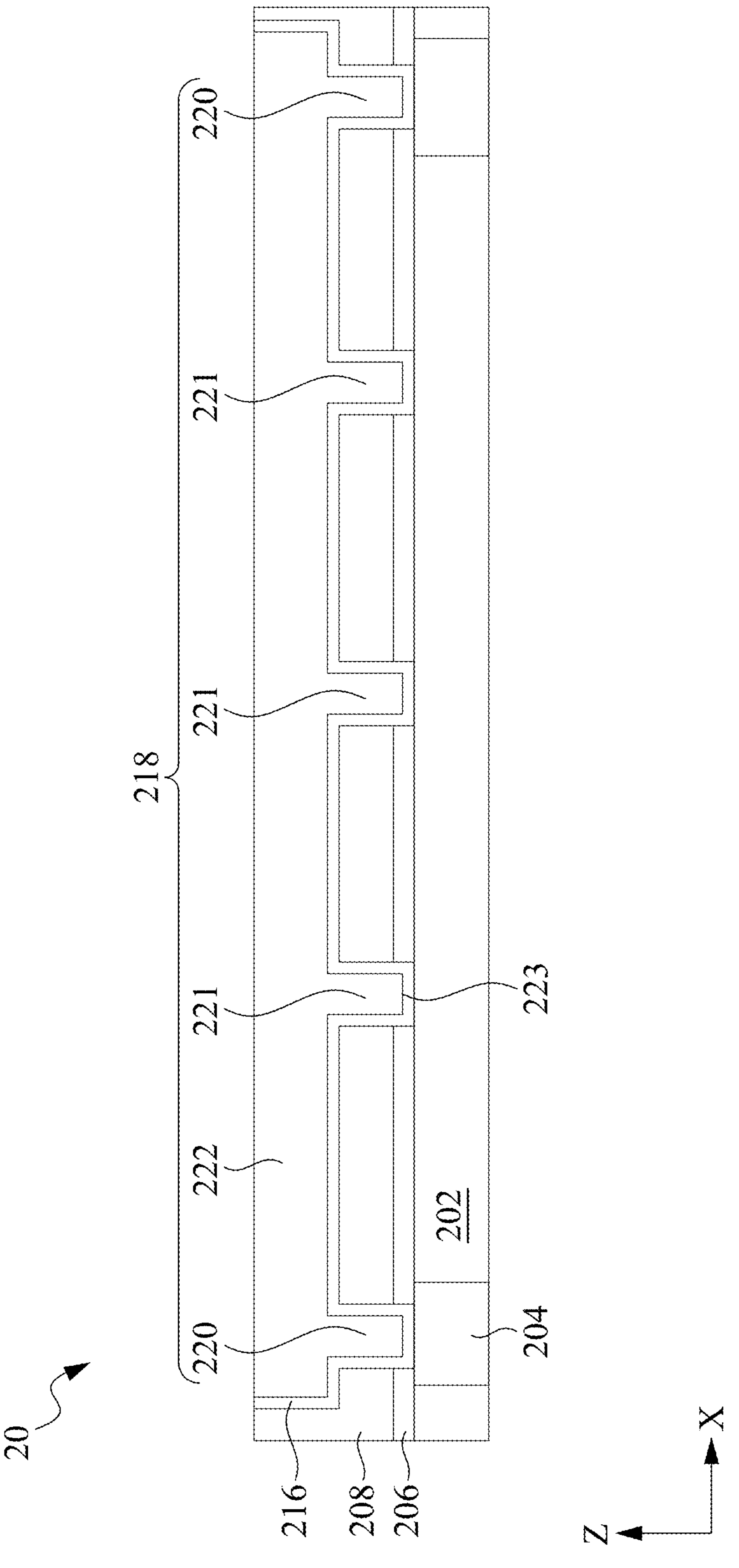

FIGS. 2A-2C are cross-sectional side views of various stages of manufacturing the interconnect structure 20, in accordance with some embodiments. As shown in FIG. 2A, the interconnect structure 20 includes a dielectric layer 202, which may be the dielectric layer 30 shown in FIG. 1A. The dielectric layer 202 may include the same material as the dielectric layer 30 and formed by the same process as the dielectric layer 30. In some embodiments, the dielectric layer 202 includes a low-k dielectric material, such as SiOCH. The dielectric layer 202 may be formed by CVD, FCVD, ALD, spin coating, or other suitable process. The dielectric layer 202 includes one or more conductive lines 204 (only two are shown) disposed in the dielectric layer 202. The conductive lines 204 may be the conductive lines 32 shown in FIG. 1A. The conductive line 204 includes an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive line 204 includes a metal. The conductive lines 204 may be formed by PVD, CVD, ALD, or other suitable process. In some embodiments, the conductive line 204 includes a barrier layer (not shown) disposed between the dielectric layer 202 and the electrically conductive material of the conductive line 204. The barrier layer may include an electrically conductive material, such as a metal and/or metal nitride.

As shown in FIG. 2A, an etch stop layer 206 is disposed on the dielectric layer 202. The etch stop layer 206 may include a nitrogen-containing material or an oxygen-containing material. For example, the etch stop layer 206 may be a nitride or an oxide, such as silicon nitride, a metal nitride, silicon oxide, or a metal oxide. In some embodiments, the etch stop layer 206 includes the same material as the CESL 11 (FIG. 1A). The etch stop layer 206 may be formed by any suitable process, such as CVD, PECVD, ALD, PEALD, or any suitable process. In some embodiments, the etch stop layer 206 is a conformal layer formed by ALD.

As shown in FIG. 2B, a dielectric layer 208 is disposed on the etch stop layer 206, and openings 210 are formed in the dielectric layer 208. The dielectric layer 208 may include the same material as the dielectric layer 202 and may be formed by the same process as the dielectric layer 202. The dielectric layer 208 may be the dielectric layer 30 (FIG. 1A) in which the power rails 36 and the dummy vias 38 are formed therein. Each opening 210 includes one or more active via openings 212, dummy via openings 213, and a trench 214. Each of the one or more active via openings 212 exposes at least a portion of the conductive line 204, as shown in FIG. 2B. Each of the one or more dummy via openings 213 exposes all dielectric materials, such as portions of the dielectric layers 202, 208 and etch stop layer 206. In other words, no electrically conductive materials are exposed in the dummy via openings 213. The openings 210 may be formed by any suitable process, such as a dual-damascene process.

As shown in FIG. 2C, a layer 216 is disposed in each opening 210, and a conductive material 218 is disposed on the layer 216 and fills each opening 210. The layer 216 may be a barrier layer that prevents the diffusion of the material of the conductive material 218 into the surrounding dielectric layers 202, 208. The layer 216 may include an electrically conductive material, such as TIN, TaN, Ti, Ta, Co, Ru, two-dimensional (2D) material, or a multilayered combination thereof. The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), or transition metal dichalcogenides ($MX_2$), where M is a transition metal element and X is a chalcogenide element. Some exemplary $MX_2$ materials may include, but are not limited to $HfTe_2$, $WS_2$, $MoS_2$, $WSe_2$, $MoSe_2$, or any combination thereof. The layer 216 may be formed by any suitable process, such as CVD, PECVD, or ALD. The conductive material 218 includes an electrically conductive material, such as Cu, Co, Ru, Mo, Cr, W, Mn, Rh, Ir, Ni, Pd, Pt, Ag, Au, Al, alloys thereof, or other suitable material. The conductive material 218 includes active via portions 220, dummy via portions 221 and a power rail portion 222. The active via portions 220 may be the conductive vias 34 (FIG. 1A), the dummy via portions 221 may be the dummy vias 38 (FIG. 1A), and the power rail portion 222 may be the power rail 36 (FIG. 1A). The active via portions 220 are disposed in the active via openings 212, and the dummy via portions 221 are disposed in the dummy via openings 213. The active via portions 220 are aligned with corresponding conductive lines 204. In some embodiments, each active via portion 220 is in contact with a corresponding portion of the layer 216, and the corresponding portion of the layer 216 is in contact with the corresponding conductive line 204.

The dummy via portions 221 are disposed in the dielectric layer 208, and at least 5 dielectric layers 30 (FIG. 1A) are disposed between the dielectric layer 208 and the ILD 10 (FIG. 1A). Because the power rail portion 222 is disposed over the devices, such as the FinFETs 60, the conductive lines 32 (FIG. 1A) and vias 34 (FIG. 1A) disposed in the at least 5 dielectric layers 30 electrically connect the FinFETs 60 to the active via portions 220, which are disposed at edges of the power rail portion 222. There are no conductive lines 32 (FIG. 1A) and vias 34 (FIG. 1A) disposed below the dummy via portions 221 in the dielectric layer 202. Thus, the dummy via portions 221 are not electrically connected to any conductive materials. As shown in FIG. 2C, each dummy via portion 221 (or dummy via 38 shown in FIG. 1A) includes a bottom surface 223 in contact with a portion of the layer 216. The portion of the layer 216 in contact with the bottom surface 223 is in contact with the dielectric layer 202. The portion of the layer 216 in contact with the bottom surface 223 is not in contact with an electrically conductive material, such as a metal or a metal nitride. Furthermore, the dummy via portions 221 and the power rail portion 222 are a monolithic and are formed by the same deposition process. As a result, atoms in the dummy via portions 221 can refill the void induced by electromigration stress in the power rail portion 222, which leads to improved lifetime of the power rail portion 222. In some embodiments, the power rail portions 222 and the dummy via portions 221 include copper, and copper atoms are supplied to the power rail portions 222 from the dummy via portions 221. Supplying of the copper atoms from the dummy via portions 221 to the power rail portions 222 may be referred to as copper reservoir effect. As described above, the dummy vias 38, or the dummy via portions 221, may have any suitable cross-sectional shape. The shape the dummy via portions 221 may be determined by the shape of the dummy via openings 213. Additional dielectric layers 30 (FIG. 1A) may be formed over the dielectric layer 208 and the power rail portion 222.

Figure 3A:
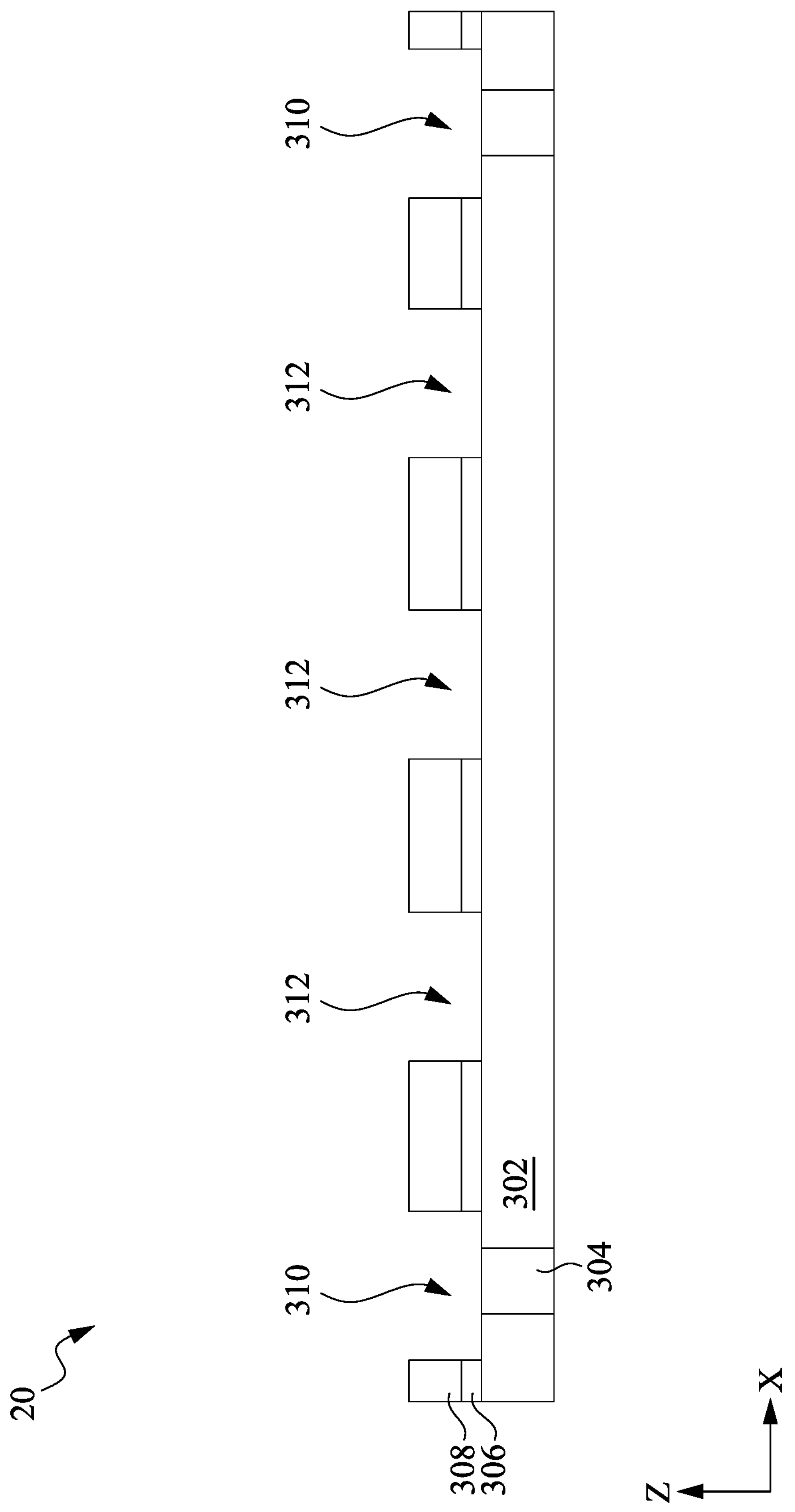
FIGS. 3A-3D are cross-sectional side views of various stages of manufacturing the interconnect structure, in accordance with alternative embodiments.

FIGS. 3A-3D are cross-sectional side views of various stages of manufacturing the interconnect structure 20, in accordance with alternative embodiments. As shown in FIG. 3A, the interconnect structure 20 includes a dielectric layer 302, which may be the dielectric layer 30 shown in FIG. 1A. The dielectric layer 302 may include the same material as the dielectric layer 30 and formed by the same process as the dielectric layer 30. In some embodiments, the dielectric layer 302 includes a low-k dielectric material, such as SiOCH. The dielectric layer 302 may be formed by CVD, FCVD, ALD, spin coating, or other suitable process. The dielectric layer 302 includes one or more conductive vias 304 (only two are shown) disposed in the dielectric layer 302. The conductive vias 304 may be the conductive vias 34 shown in FIG. 1A. The conductive via 304 includes an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive via 304 includes a metal. The conductive vias 304 may be formed by PVD, CVD, ALD, or other suitable process. In some embodiments, the conductive via 304 includes a barrier layer (not shown) disposed between the dielectric layer 302 and the electrically conductive material of the conductive via 304. The barrier layer may include an electrically conductive material, such as a metal and/or metal nitride.

As shown in FIG. 3A, an etch stop layer 306 is disposed on the dielectric layer 302, and a dielectric layer 308 is disposed on the etch stop layer 306. The etch stop layer 306 may include the same material as the etch stop layer 206 and formed by the same process as the etch stop layer 206. The dielectric layer 308 may include the same material as the dielectric layer 302 and may be formed by the same process as the dielectric layer 302. One or more active trenches 310 and one or more dummy trenches 312 are formed in the dielectric layer 308 and the etch stop layer 306. Each of the one or more active trenches 310 exposes at least a portion of the conductive via 304, as shown in FIG. 3A. Each of the one or more dummy trenches 312 exposes all dielectric materials, such as portions of the dielectric layers 302, 308 and etch stop layer 306. In other words, no electrically conductive materials are exposed in the dummy trenches 312.

Figure 3B:
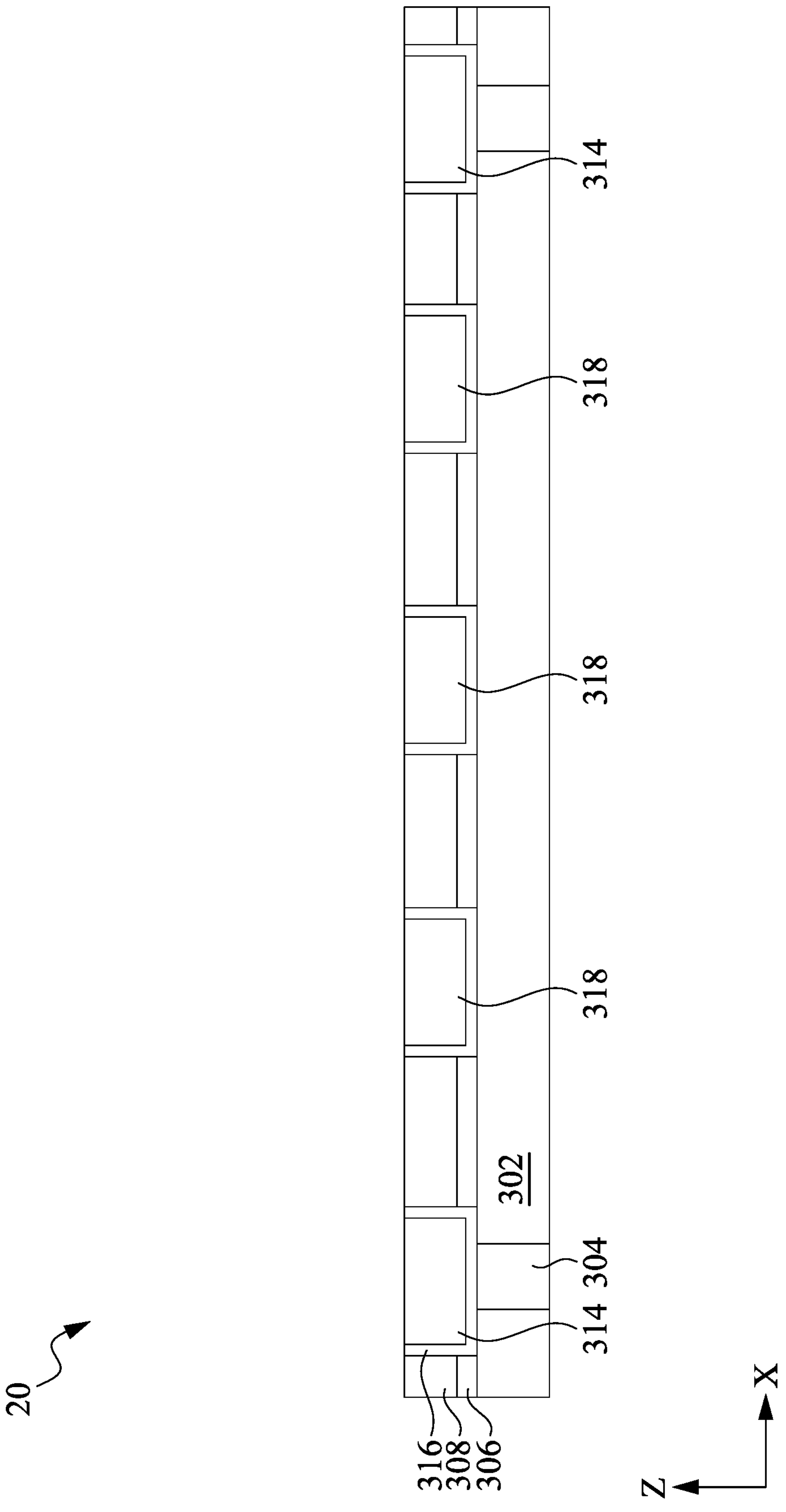

As shown in FIG. 3B, a layer 316 is disposed in each trench 310, 312, a conductive line 314 is disposed on the layer 316 and fills each active trench 310, and a dummy line 318 is disposed on the layer 316 and fills each dummy trench 312. The layer 316 may be a barrier layer that prevents the diffusion of the material of the conductive lines 314 and dummy lines 318 into the surrounding dielectric layers 302, 308. The layer 316 may include the same material as the layer 216 and formed by the same process as the layer 216. Each of the conductive line 314 and dummy line 318 includes an electrically conductive material, such as Cu, Co, Ru, Mo, Cr, W, Mn, Rh, Ir, Ni, Pd, Pt, Ag, Au, Al, alloys thereof, or other suitable material. The conductive line 314 may be the conductive lines 32 (FIG. 1A), and the dummy lines 318 may be disposed below the dummy vias 38 (FIG. 1A). The conductive lines 314 are aligned with corresponding conductive vias 304. In some embodiments, each conductive line 314 is in contact with a corresponding portion of the layer 316, and the corresponding portion of the layer 316 is in contact with the corresponding conductive via 304.

The dummy lines 318 are disposed in the dielectric layer 308, and at least 5 dielectric layers 30 (FIG. 1A) are disposed between the dielectric layer 308 and the ILD 10 (FIG. 1A) in order to prevent the dummy lines 318 from electrically connecting to any conductive vias 34 (FIG. 1A).

Figure 3C:
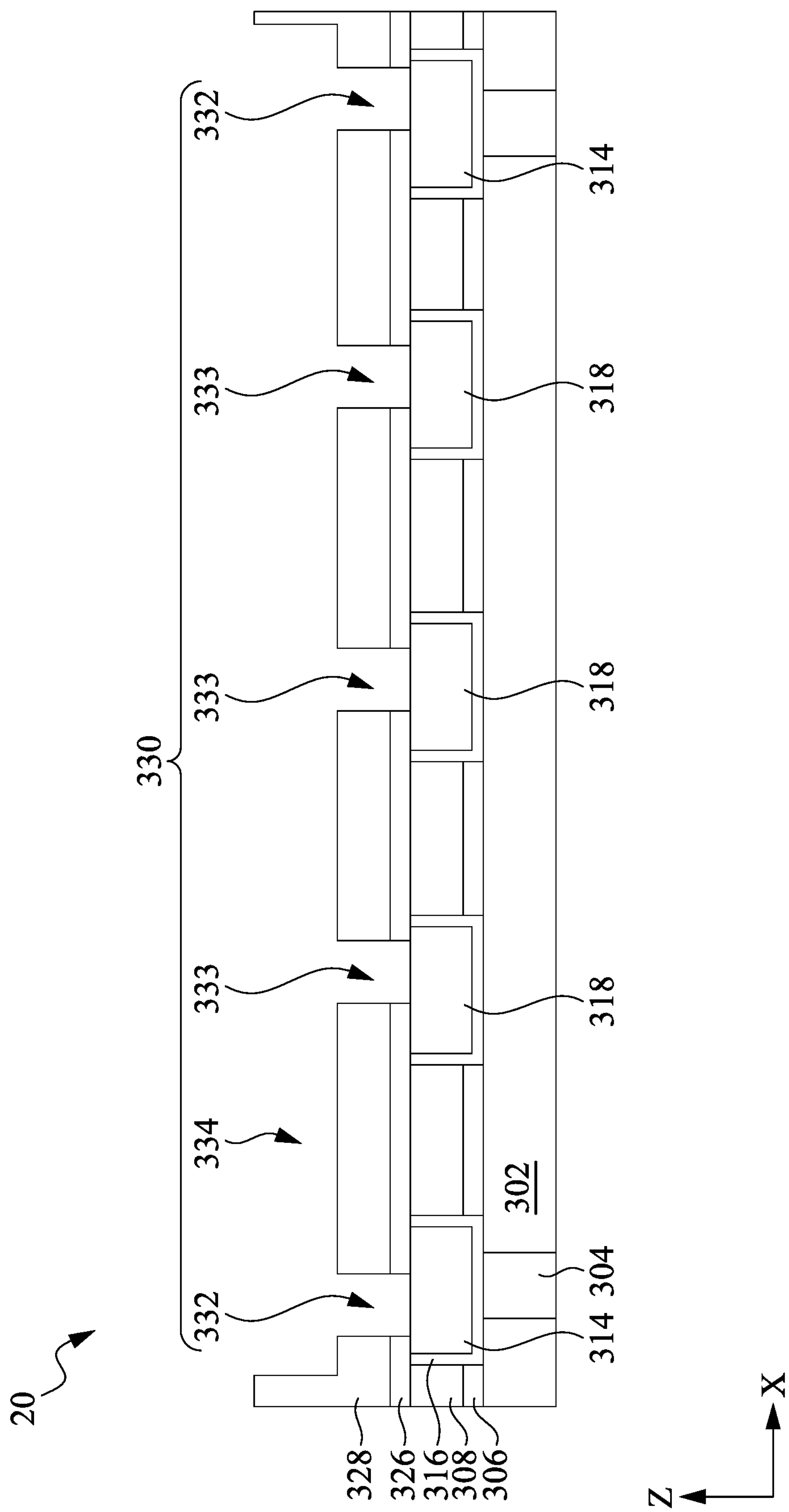

As shown in FIG. 3C, an etch stop layer 326 is disposed on the dielectric layer 308, a dielectric layer 328 is disposed on the etch stop layer 326, and openings 330 are formed in the dielectric layer 328. The etch stop layer 326 may include the same material as the etch stop layer 306 and formed by the same process as the etch stop layer 306. The dielectric layer 328 may include the same material as the dielectric layer 302 and may be formed by the same process as the dielectric layer 302. The dielectric layer 328 may be the dielectric layer 30 (FIG. 1A) in which the power rails 36 and the dummy vias 38 are formed therein. Each opening 330 includes one or more active via openings 332, dummy via openings 333, and a trench 334. Each of the one or more active via openings 332 exposes at least a portion of the conductive line 314, as shown in FIG. 3C. Each of the one or more dummy via openings 333 exposes at least a portion of the dummy lines 318. The dummy lines 318 may function as an etch stop layer when forming the dummy via openings 333. The openings 330 may be formed by any suitable process, such as a dual-damascene process.

Figure 3D:
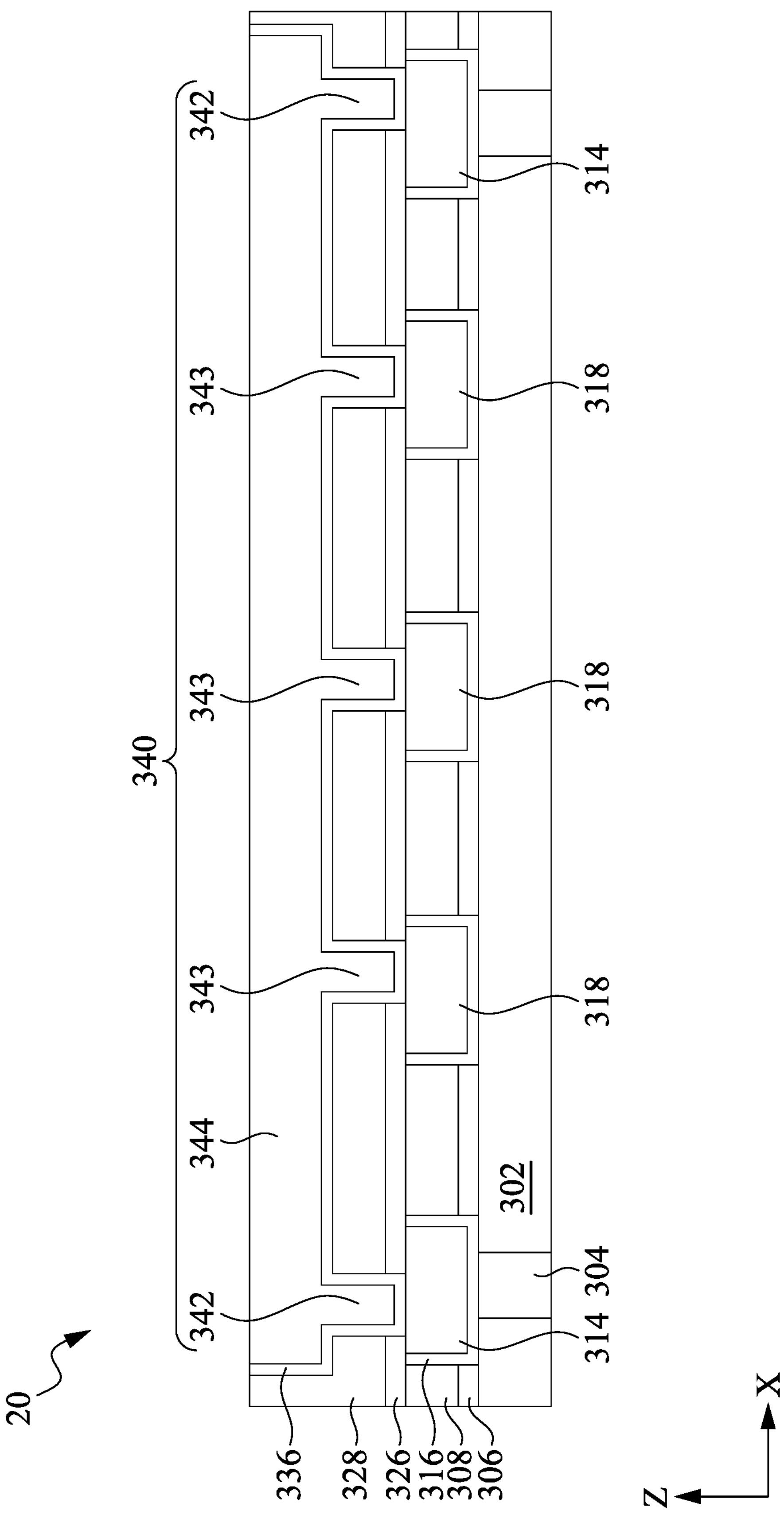

As shown in FIG. 3D, a layer 336 is disposed in each opening 330, and a conductive material 340 is disposed on the layer 336 and fills each opening 330. The layer 336 may be a barrier layer that prevents the diffusion of the material of the conductive material 340 into the surrounding dielectric layer 328. The layer 336 may include the same material as the layer 316 and formed by the same process as the layer 316. The conductive material 340 includes an electrically conductive material, such as Cu, Co, Ru, Mo, Cr, W, Mn, Rh, Ir, Ni, Pd, Pt, Ag, Au, Al, alloys thereof, or other suitable material. The conductive material 340 includes active via portions 342, dummy via portions 343, and a power rail portion 344. The active via portions 342 may be the conductive vias 34 (FIG. 1A), the dummy via portions 343 may be the dummy vias 38 (FIG. 1A), and the power rail portion 344 may be the power rail 36 (FIG. 1A). The active via portions 342 are disposed in the active via openings 332, and the dummy via portions 343 are disposed in the dummy via openings 333. The active via portions 342 are aligned with corresponding conductive lines 314. In some embodiments, each active via portion 342 is in contact with a corresponding portion of the layer 336, and the corresponding portion of the layer 336 is in contact with the corresponding conductive line 314. The dummy via portions 343 are aligned with corresponding dummy lines 318. In some embodiments, each dummy via portion 343 is in contact with a corresponding portion of the layer 336, and the corresponding portion of the layer 336 is in contact with the corresponding dummy line 318. Additional dielectric layers 30 (FIG. 1A) may be formed over the dielectric layer 328 and the power rail portion 344.

Figure 4A:
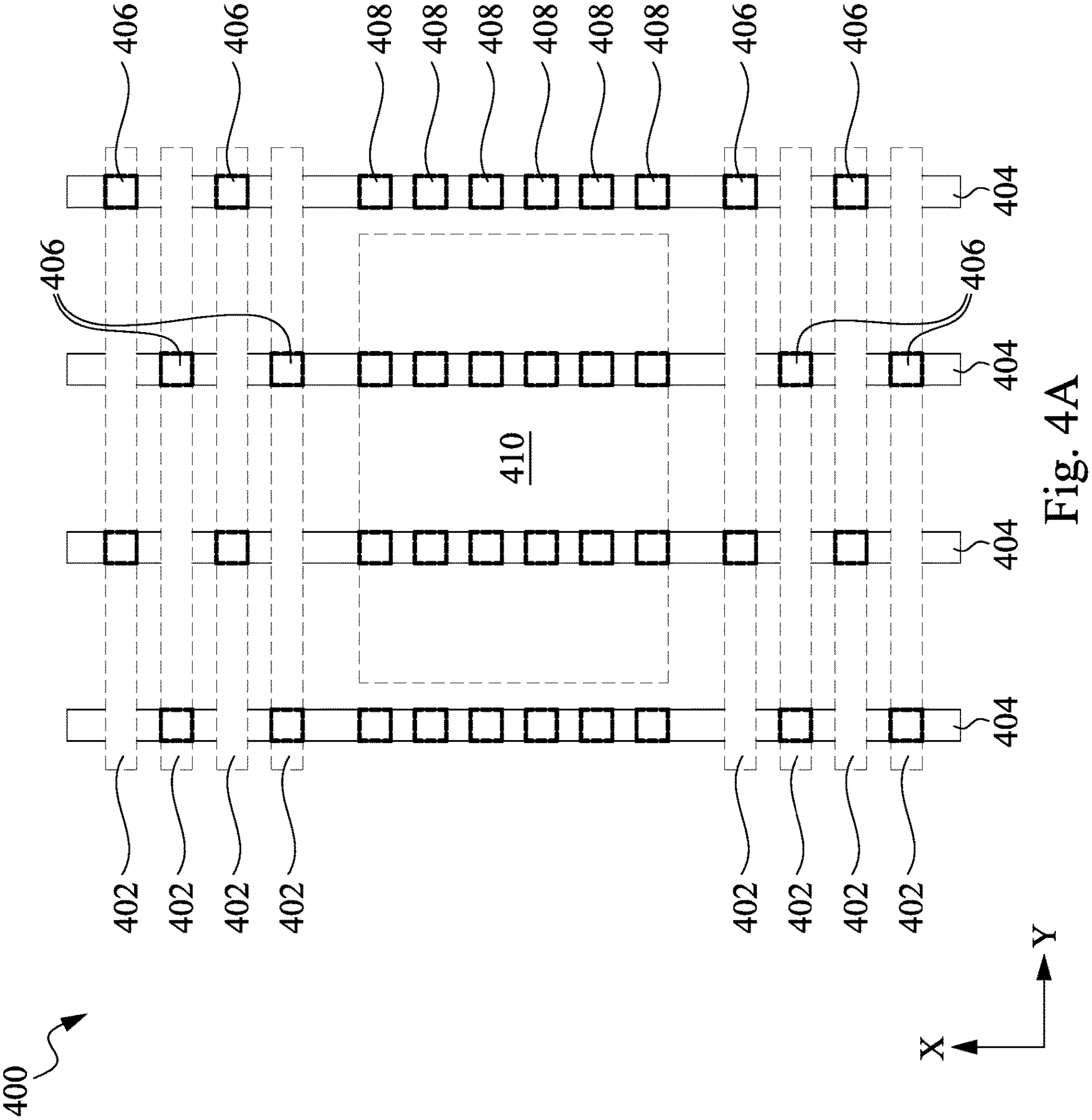
FIG. 4A is a top view of a power net located in the interconnect structure, in accordance with some embodiments.

FIG. 4A is a top view of a power net 400 located in the interconnect structure 20, in accordance with some embodiments. As shown in FIG. 4A, the power net 400 includes a plurality of conductive lines 402, a plurality of power rails 404 disposed over the conductive lines 402, and a plurality of conductive vias 406 connecting corresponding conductive lines 402 and power rails 404. The conductive lines 402 may be the conductive lines 32 shown in FIG. 1A or the conductive lines 204 shown in FIG. 2C. The power rails 404 may be the power rails 36 shown in FIG. 1A or the power rail portions 222 shown in FIG. 2C. The conductive vias 406 may be the conductive vias 34 shown in FIG. 1A or the active via portions 220 shown in FIG. 3C. The power net 400 further includes a plurality of dummy vias 408 disposed below each power rail 36 between the conductive lines 402. The power rail 36 and the dummy vias 408 disposed therebelow are monolithic. The dummy vias 408 may be the dummy vias 38 shown in FIG. 1A or the dummy via portions 221 shown in FIG. 2C.

As shown in FIG. 4A, the power net 400 is disposed over an active region 410. The active region 410 may include devices, such as FinFETs 60 shown in FIG. 1A. In some embodiments, each power rail 404 is configured as outbound power rail for VDD or VSS of one or more functional circuit devices of the active region 410. The conductive lines 402 and vias 406 disposed below the power rails 404 are located at the ends of the power rails 404. The plurality of dummy vias 408 are located at the center of the power rails 404. Even though the dummy vias 408 may be disposed over the active region 410, the dummy vias 408 are not electrically connected to the active region 410 due to additional dielectric layers 30 (FIG. 1A) disposed between the active region 410 and the dummy vias 408. Conductive features and lines disposed in the additional dielectric layers 30 (FIG. 1A) route the electrical connection to the power rails 404 at end thereof. Each of the plurality of conductive lines 402 may have a width that is allowed in the design rule manual (DRM), and the line pitch may have any dimensions allowed in the DRM. The size of the dummy via 408 may be any size allowed in the DRM.

Figure 4B:
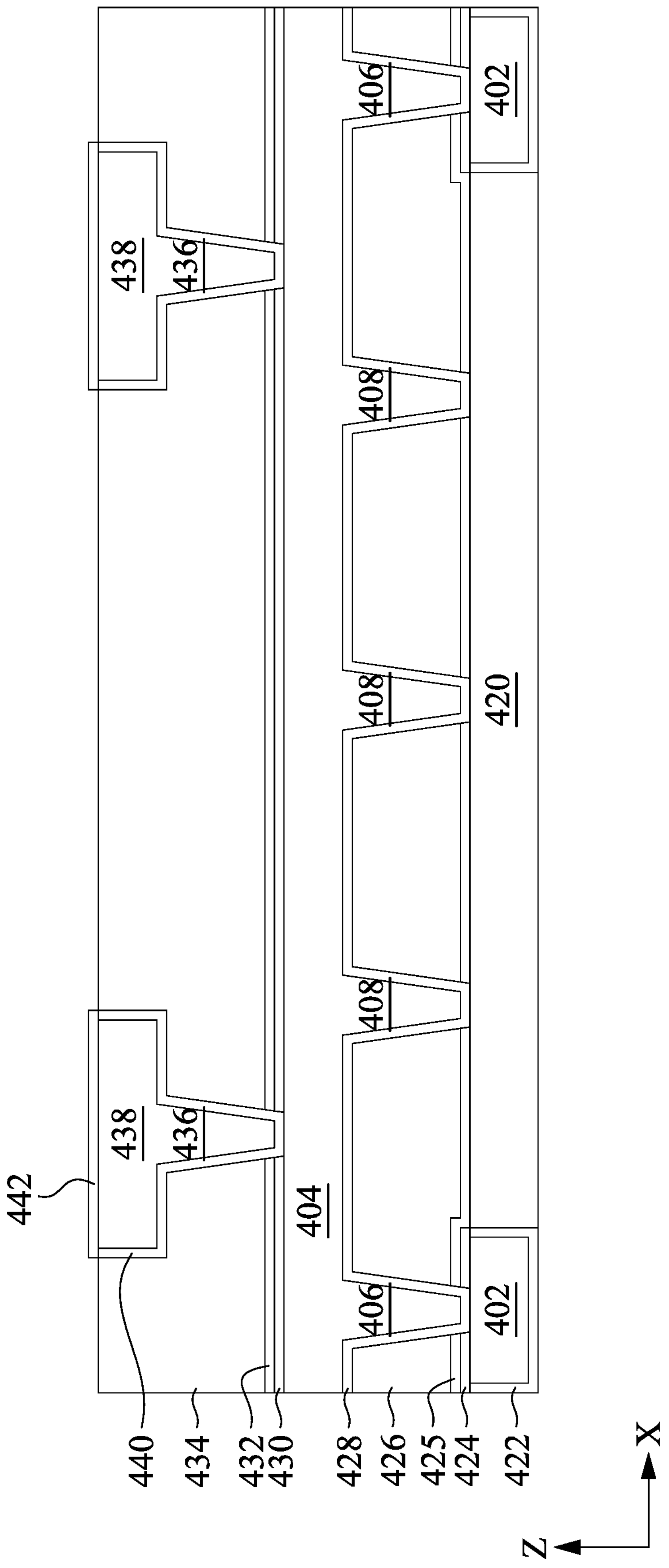
FIG. 4B is a cross-sectional side view of a power rail having a plurality of dummy vias, in accordance with some embodiments.

FIG. 4B is a cross-sectional side view of the power rail 404 having a plurality of dummy vias 408, in accordance with some embodiments. As shown in FIG. 4B, the conductive lines 402 are disposed in a dielectric layer 420. The dielectric layer 420 may include the same material as the dielectric layer 30 (FIG. 1A) and formed by the same process as the dielectric layer 30 (FIG. 1A). A barrier layer 422 may be disposed between each conductive line 402 and the dielectric layer 420. The barrier layer 422 may include the same material as the layer 216 (FIG. 2C) and formed by the same process as the layer 216 (FIG. 2C). A capping layer 424 is disposed on a portion of each conductive line 402. The capping layer 424 may be a metal or metal alloy, such as Co, CoW, Ru, W, a dielectric material, such as SiCN, SiOC, or a 2D material, such as graphene or BN. The capping layer 424 may be selectively formed on the conductive lines 402 by any suitable selective deposition process. For example, in some embodiments, a blocking layer (not shown) is selectively formed on the dielectric material of dielectric layer 420. The blocking layer may include a head that is attached to the dielectric layer 420 but not the metallic surfaces of the conductive line 402 and the barrier layer 422. The blocking layer also includes a tail that prevents the precursors of the capping layer 424 from forming thereon. As a result, the capping layer 424 is formed on the metallic surfaces of the conductive line 402 and the barrier layer 422 but not on the blocking layer. After forming the capping layer 424, the blocking layer is removed. In some embodiments, the capping layer 424 is formed by ALD, CVD, or ELD and has a thickness ranging from about 2 Angstroms to about 100 Angstroms.

As shown in FIG. 4B, an etch stop layer 425 is disposed on the cap layer 424 and the dielectric layer 420. The etch stop layer 425 may include the same material as the etch stop layer 206 (FIG. 2C) and formed by the same process as the etch stop layer 206 (FIG. 2C). A dielectric layer 426 is disposed on the etch stop layer 425, and the power rail 404, the conductive vias 406, and the dummy vias 408 are disposed in the dielectric layer 426. The dielectric layer 426 may include the same material as the dielectric layer 420 and formed by the same process as the dielectric layer 420. A layer 428 may be disposed between the power rail 404, the conductive vias 406, the dummy vias 408 and the dielectric layer 426. The layer 428 may be a barrier layer and may include the same material as the layer 216 (FIG. 2C). As shown in FIG. 4B, the conductive vias 406 are aligned with corresponding conductive lines 402, and the dummy vias 408 are disposed over the dielectric layer 420. The dummy vias 408 are not electrically connected to any electrically conductive material disposed in the dielectric layer 420. The dummy vias 408 may have a pitch ranging from a minimum pitch to about 20 times the minimum pitch allowed in the DRM. In some embodiments, the conductive line 402 has a first depth along the z-axis, and the dummy via 408 has a second depth along the z-axis. The second depth may be 0.5 times to about 1.5 times the first depth. With the dummy vias 408, the electrical resistance of the power rail 404 is reduced by about 60 percent, and the lifetime of the power rail 404 is improved by two-fold to five-fold. Furthermore, because the electrical resistance is reduced, Joule-heating effect on the power rails 404 is also reduced because the dummy vias 408 can function as a heat sink.

As shown in FIG. 4B, a cap layer 430 is disposed on the power rail 404, an etch stop layer 432 is disposed on the cap layer 430, and a dielectric layer 434 is disposed on the etch stop layer 432. The cap layer 430 may include the same material as the cap layer 424, the etch stop layer 432 may include the same material as the etch stop layer 425, and the dielectric layer 434 may include the same material as the dielectric layer 426. Conductive vias 436 and lines 438 are disposed in the dielectric layer 434. In some embodiments, a barrier layer 440 is disposed between the conductive line 438, the conductive via 436 and the dielectric layer 434. The conductive via 436, the conductive line 438, and the barrier layer 440 may include the same materials as the conductive via 406, the conductive line 402, and the barrier layer 422, respectively. The barrier layer 440 may be in contact with the power rail 404. A cap layer 442 may be disposed on each conductive line 438 and the barrier layer 440. The cap layer 442 may include the same material as the cap layer 424.

Figure 5A:
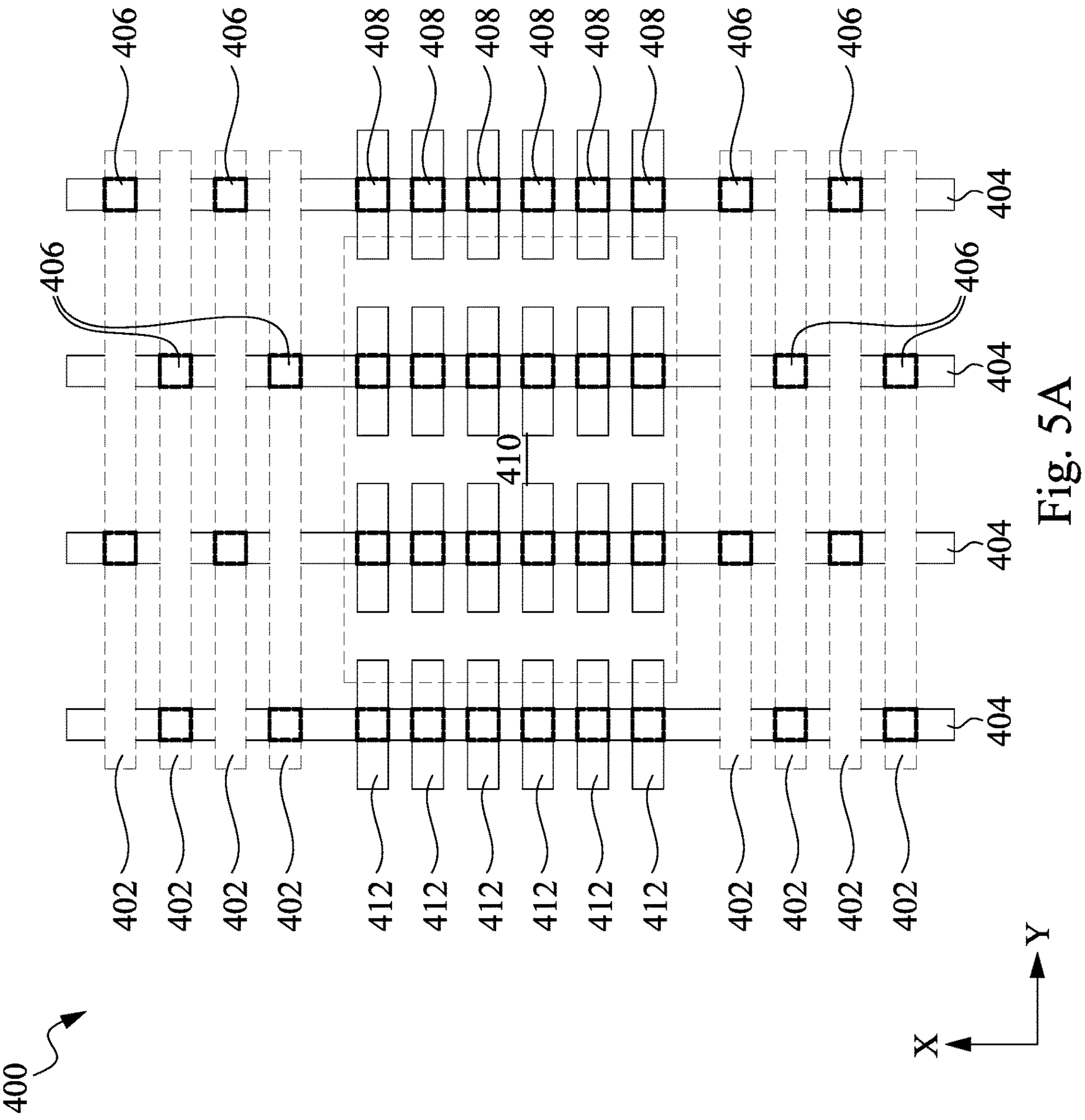
FIG. 5A is a top view of the power net located in the interconnect structure, in accordance with alternative embodiments.

FIG. 5A is a top view of the power net 400 located in the interconnect structure 20, in accordance with alternative embodiments. As shown in FIG. 5A, in addition to the conductive lines 402, the power rails 404, the conductive vias 406, the dummy vias 408, the power net 400 further includes a plurality of dummy lines 412 disposed below corresponding dummy vias 408. The dummy lines 412 may be disposed at the same level as the conductive lines 402. Unlike the conductive lines 402 that are electrically connected the devices of the active region 410, the dummy lines 412 are not electrically connected to the devices of the active region 410. The dummy line 412 may have a length along the y-axis substantially less than a length of the conductive line 402.

Figure 5B:
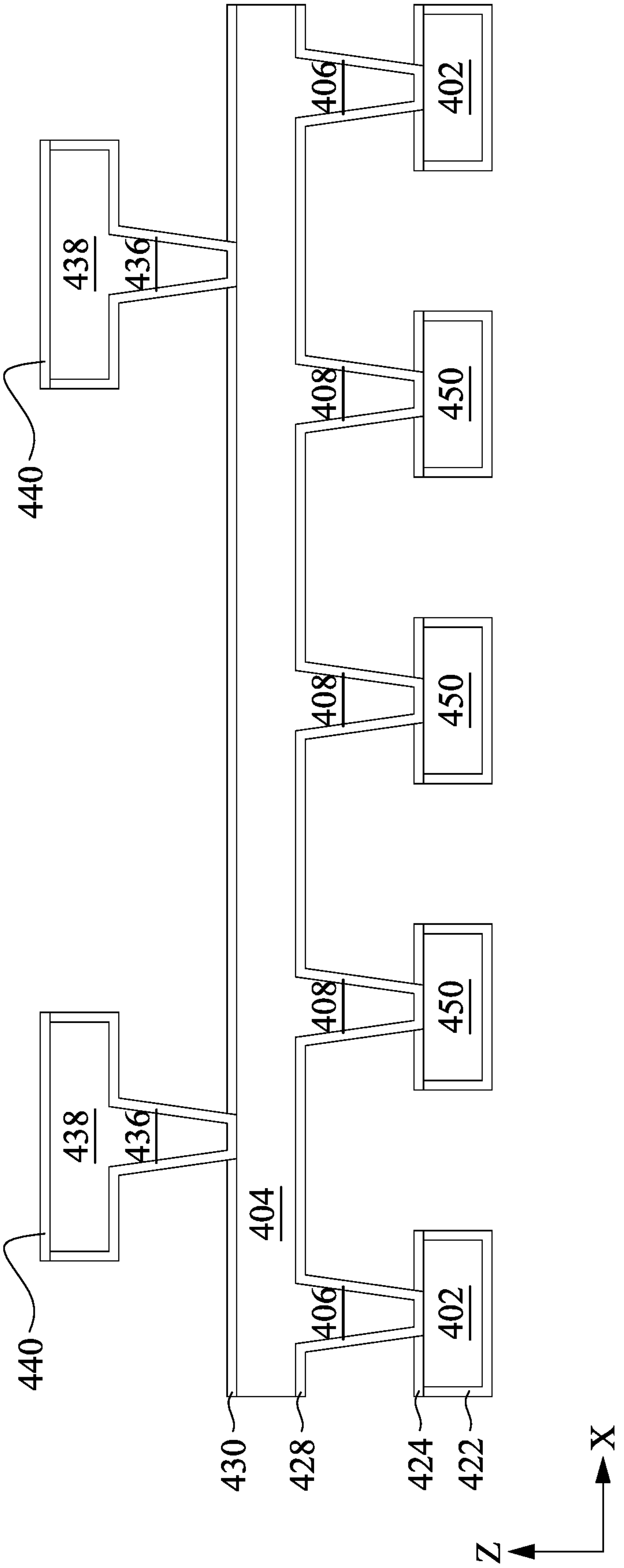
FIG. 5B is a cross-sectional side view of the power rail having the plurality of dummy vias, in accordance with alternative embodiments.

FIG. 5B is a cross-sectional side view of the power rail 404 having the plurality of dummy vias 408, in accordance with alternative embodiments. As shown in FIG. 5B, the dummy vias 408 are disposed over corresponding dummy lines 450. The dummy lines 450 may be the dummy lines 318 shown in FIG. 3D. The dummy lines 450 may include the same material as the dummy lines 318 and formed by the same process as the dummy lines 318. The capping layer 424 is disposed on a portion of each dummy line 450. The dummy lines 450 are not electrically connected to the devices of the active region 410 (FIG. 5A).

Figure 6E:
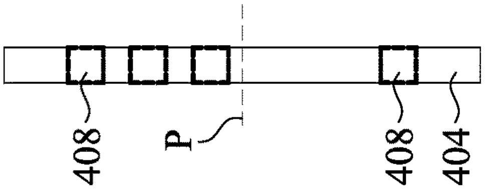
FIGS. 6A-6E are top views of the power rail having the plurality of dummy vias, in accordance with some embodiments.
Figure 6D:
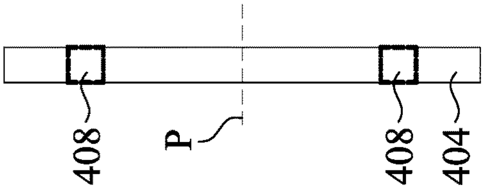
Figure 6C:
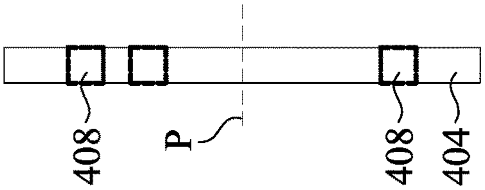
Figure 6B:
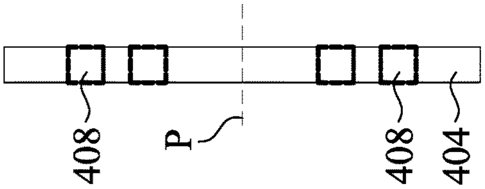
Figure 6A:
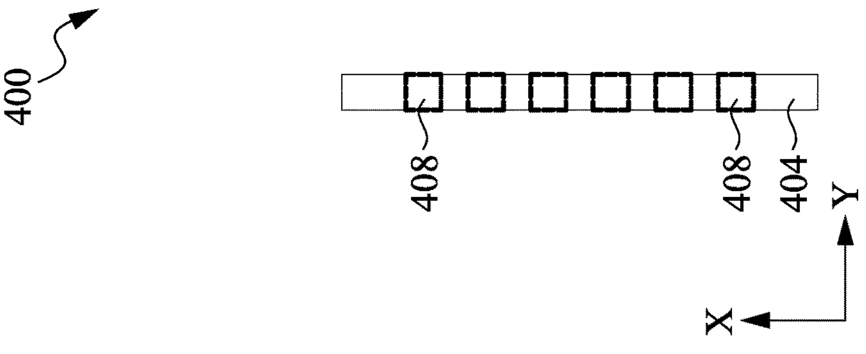
Figure 7E:
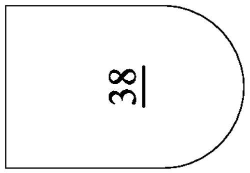
FIGS. 7A-7E are cross-sectional side views of the dummy via, in accordance with some embodiments.
Figure 7D:
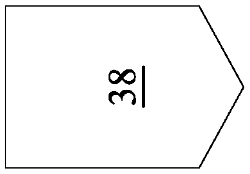
Figure 7C:
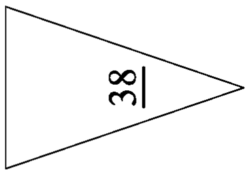
Figure 7B:
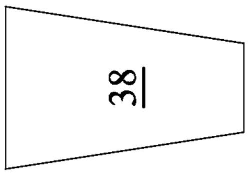
Figure 7A:
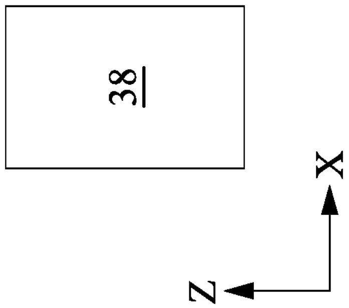

FIGS. 6A-6E are top views of the power rail 404 having the plurality of dummy vias 408, in accordance with some embodiments. As shown in FIG. 6A, the plurality of dummy vias 408 are disposed equally spaced apart. In other words, the distances between adjacent dummy vias 408 are substantially the same. As shown in FIGS. 6B and 6D, the dummy vias 408 may be located below the power rail 404 in a way that is substantially symmetric with respect to a plane P that is substantially perpendicular to the longitudinal direction of the power rail 404. For example, there may be 2 dummy vias 408 on opposite sides with respect to the plane P, as shown in FIG. 6B. Alternatively, there may be 1 dummy via 408 on opposite sides with respect to the plane P. As shown in FIGS. 6C and 6E, the dummy vias 408 may be located below the power rail 404 in a way that is substantially asymmetric with respect to the plane P. For example, there may be 2 dummy vias 408 on one side and 1 dummy via 408 on the opposite side with respect to the plane P, as shown in FIG. 6C. Alternatively, there may be 3 dummy vias 408 on one side and 1 dummy via 408 on the opposite side with respect to the plane P. The number of dummy vias 408 and the arrangements of the dummy vias 408 shown in FIGS. 6A to 6E are merely examples and are not intended to be limiting. Any suitable number and arrangement of the dummy vias 408 may be utilized.

The present disclosure in various embodiments provides an interconnect structure including a power rail having one or more dummy vias attached thereto. The dummy vias and the power rail are monolithic. Some embodiments may achieve advantages. For example, the dummy vias reduces electrical resistance and joule-heating effect on the power rail. Furthermore, the electromigration lifetime of the power rail is increased by having the dummy vias due to the copper reservoir effect.

An embodiment is an interconnect structure. The structure includes a first dielectric layer, first and second conductive lines disposed in the first dielectric layer, a second dielectric layer disposed over the first dielectric layer, a power rail disposed in the second dielectric layer, first conductive via disposed between the power rail and the first conductive line, second conductive via disposed between the power rail and the second conductive line, and one or more dummy vias disposed between the power rail and the first dielectric layer. The power rail and the one or more dummy vias are monolithic.

Another embodiment is an interconnect structure. The structure includes a first dielectric layer, one or more conductive lines disposed in the first dielectric layer, a second dielectric layer disposed over the first dielectric layer, a power rail disposed in the second dielectric layer, one or more conductive vias disposed below the power rail, one or more dummy vias disposed below the power rail, and a layer disposed between the power rail and the second dielectric layer. The layer includes first portions in contact with the one or more conductive vias and the one or more conductive lines and second portions in contact with the one or more dummy vias and the first dielectric layer.

A further embodiment is a method. The method includes forming a first dielectric layer over a second dielectric layer and forming an opening in the first dielectric layer. The opening includes one or more active via openings, one or more dummy via openings, and a trench located above the active via openings and dummy via openings. No electrically conductive material is exposed in the dummy via openings. The method further includes forming a conductive material in the opening. The conductive material includes one or more active via portions, one or more dummy via portions, and a power rail portion. The one or more active via portions are disposed in the one or more active via openings, the one or more dummy via portions are disposed in the one or more dummy via openings, and the power rail portion is disposed in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a first dielectric layer over a second dielectric layer;

forming an opening in the first dielectric layer, wherein the opening comprises one two active via openings, a plurality of dummy via openings disposed between the two active via openings, and a trench located above the active via openings and dummy via openings, wherein no electrically conductive material is exposed in the dummy via openings; and forming a conductive material in the opening, wherein the conductive material comprises two active via portions, a plurality of dummy via portions disposed between the two active via portions, and a power rail portion, wherein the two active via portions are disposed in the two active via openings, the plurality of dummy via portions are disposed in the plurality of dummy via openings, and the power rail portion is disposed in the trench.

2. The method of claim 1, wherein a portion of a conductive line is exposed in each of the two active via openings, wherein the conductive line is disposed in the second dielectric layer.

3. The method of claim 1, further comprising forming a first etch stop layer on the second dielectric layer, wherein the first dielectric layer is formed on the first etch stop layer.

4. The method of claim 3, wherein portions of the first etch stop layer are exposed in the two active via openings and the plurality of dummy via openings.

5. The method of claim 4, further comprising forming a second etch stop layer over the power rail portion.

6. The method of claim 5, further comprising forming a third dielectric layer on the second etch stop layer.

7. A method, comprising:

depositing a first dielectric layer over a second dielectric layer;

forming an opening in the first dielectric layer, wherein the opening comprises a first plurality of active via openings, a second plurality of active via openings, a plurality of dummy via openings disposed between the first and second pluralities of active via openings, and a trench located above the first and second pluralities of active via openings and the plurality of dummy via openings, wherein conductive lines are exposed in the first and second pluralities of active via openings, and the second dielectric layer is exposed at a in the plurality of dummy via openings; and forming a conductive material in the opening, wherein the conductive material comprises a first plurality of active via portions, a second plurality of active via portions, a plurality of dummy via portions, and a power rail portion located over the first and second pluralities of active via portions and the plurality of dummy via portions.

8. The method of claim 7, wherein the power rail portion, the first and second pluralities of active via portions, and the plurality of dummy via portions are monolithic.

9. The method of claim 7, further comprising selectively depositing a first capping layer on the conductive line.

10. The method of claim 9, further comprising depositing a first etch stop layer on the first capping layer and the second dielectric layer.

11. The method of claim 10, further comprising depositing a layer in contact with the first dielectric layer, the first etch stop layer, the first capping layer, and the second dielectric layer, wherein the conductive material is formed on the layer.

12. The method of claim 11, wherein the layer comprises TIN, TaN, Ti, Ta, Co, Ru, graphene, hexagonal boron nitride, or transition metal dichalcogenides.

13. A method, comprising:

depositing a first dielectric layer over a second dielectric layer;

forming first and second active trenches and a plurality of dummy trenches between the first and second active trenches in the first dielectric layer, wherein a first conductive via is exposed at a bottom of the first active trench, and a second conductive via is exposed at a bottom of the second active trench;

depositing a first conductive line in the first active trench, a second conductive line in the second active trench, and a plurality of dummy lines in the plurality of dummy trenches;

depositing a third dielectric layer over the first dielectric layer, the first and second conductive lines, and the plurality of dummy lines;

forming an opening in the third dielectric layer, wherein the opening comprises a first active via opening, a second active via opening, a plurality of dummy via openings, and a trench located above the first and second active via openings and the plurality of dummy via openings, wherein the first conductive line is exposed at a bottom of the first active via opening, and the second conductive line is exposed at a bottom of the second active via opening; and forming a conductive material in the third opening, wherein the conductive material comprises a first active via portion, a second active via portion, a plurality of dummy via portions between the first and second active via portions, and a power rail portion located over the first and second active via portions and the first plurality of dummy via portions.

14. The method of claim 13, wherein the power rail portion, the first and second active via portions, and the plurality of dummy via portions are monolithic.

15. The method of claim 7, further comprising depositing a second etch stop layer on the second dielectric layer, wherein the first dielectric layer is deposited on the second etch stop layer.

16. The method of claim 15, further comprising selectively depositing a second capping layer on one of the conductive lines, wherein the second etch stop layer is deposited on the second capping layer.

17. The method of claim 16, wherein the second capping layer comprises a metal or a dielectric material.

18. The method of claim 7, wherein the plurality of dummy via portions are disposed equally spaced apart.

19. The method of claim 7, wherein the plurality of dummy via portions are symmetric with respect to a plane perpendicular to a longitudinal direction of the power rail portion.

20. The method of claim 7, wherein the plurality of dummy via portions are asymmetric with respect to a plane perpendicular to a longitudinal direction of the power rail portion.

* * * * *